United States Patent
Chen

(10) Patent No.: US 9,195,268 B2
(45) Date of Patent: Nov. 24, 2015

(54) ELECTRONIC DEVICE WITH A FOLDABLE COVER FOR COVERING A USER OPERABLE DEVICE

(71) Applicants: DARFON ELECTRONICS (SUZHOU) CO., LTD., Suzhou, Jiangsu Province (CN); DARFON ELECTRONICS CORP., Taoyuan (TW)

(72) Inventor: Chih-Hao Chen, Taoyuan (TW)

(73) Assignees: DARFON ELECTRONICS (SUZHOU) CO., LTD., New District, Suzhou, Jiangsu Province; DARFON ELECTRONICS CORP., Gueishan, Taoyuan (TW)

( * ) Notice: Subject to any disclaimer, the term of this patent is extended or adjusted under 35 U.S.C. 154(b) by 0 days.

(21) Appl. No.: 14/621,360

(22) Filed: Feb. 12, 2015

(65) Prior Publication Data

US 2015/0160697 A1      Jun. 11, 2015

Related U.S. Application Data

(63) Continuation of application No. 13/792,188, filed on Mar. 10, 2013, now Pat. No. 8,995,149.

(30) Foreign Application Priority Data

Apr. 19, 2012   (TW) .............................. 101207228 U

(51) Int. Cl.
| | |
|---|---|
| *H05K 7/02* | (2006.01) |
| *H05K 7/04* | (2006.01) |
| *G06F 1/16* | (2006.01) |
| *H05K 7/14* | (2006.01) |

(52) U.S. Cl.
CPC ................. *G06F 1/1632* (2013.01); *H05K 7/14* (2013.01)

(58) Field of Classification Search
USPC ...................... 361/807, 809, 810, 755, 679.01
See application file for complete search history.

(56) References Cited

U.S. PATENT DOCUMENTS

| | | |
|---|---|---|
| 5,996,778 A | 12/1999 | Shih |
| 6,447,196 B1 | 9/2002 | Arkwright |
| 7,545,634 B2 | 6/2009 | Simonian |
| 8,358,513 B2 | 1/2013 | Kim |
| 8,424,829 B2 | 4/2013 | Lu |
| 8,544,639 B2 | 10/2013 | Yang |
| 8,757,375 B2 | 6/2014 | Huang |
| 8,915,357 B2 * | 12/2014 | Mecchella ................. 206/45.23 |
| D726,192 S * | 4/2015 | Massucco et al. ........... D14/440 |
| 9,049,911 B1 * | 6/2015 | Wood et al. ........................... 1/1 |
| 2006/0285283 A1 * | 12/2006 | Simonian et al. ............. 361/679 |
| 2013/0020216 A1 | 1/2013 | Chiou |
| 2013/0043148 A1 * | 2/2013 | Chen et al. ................. 206/45.23 |

* cited by examiner

Primary Examiner — Hung S Bui
(74) *Attorney, Agent, or Firm* — Winston Hsu; Scott Margo

(57) ABSTRACT

The invention provides an electronic device including a user operable device and a foldable cover flexibly connected to the user operable device and capable to cover a whole top of the user operable device. The foldable cover includes a plurality of sections and a plurality of foldable lines, so that the foldable cover can be folded along the plurality of foldable lines formed between different sections. The sections are connected through the flexible foldable lines to allow the adjacent sections foldable with respective to one another to make the foldable cover in a supporting state, so that a first fastening section and a second fastening section are releasably fastened together so as to fasten a first supporting section and a second supporting section, and a first attachment section and a second attachment section are placed flatly on a plane.

20 Claims, 9 Drawing Sheets

ELECTRONIC DEVICE WITH A FOLDABLE COVER FOR COVERING A USER OPERABLE DEVICE

CROSS REFERENCE TO RELATED APPLICATIONS

This is a continuation application of application Ser. No. 13/792,188, filed Mar. 10, 2013, which claims the benefit of Taiwan Application No. 101207228, filed on Apr. 19, 2012, the contents of which are incorporated herein by reference.

BACKGROUND OF THE INVENTION

1. Field of the Invention

The present invention relates to an electronic device, and more specifically, to an electronic device with a foldable cover capable of covering a top of a user operable device and capable of supporting a portable device at a supporting state by rotation alternatively.

2. Description of the Prior Art

Since modern technology trends to small size and light weight, a portable computer has been more and more popular in computer industry. Accordingly, a keyboard as an input interface equipped for the portable computer also trends to a thin size. A keyboard cover is designed for preventing careless touch of the keyboard when the keyboard is not used. Furthermore, a supporting frame is designed for supporting the portable computer when the portable computer is used. However, there is no peripheral device cooperating with the keyboard as combination of the keyboard cover and the supporting frame in the market.

SUMMARY OF THE INVENTION

The present invention provides an electronic device with a foldable cover capable of covering a top of a user operable device and capable of supporting a portable device at a supporting state by rotation alternatively.

According to an embodiment of the present invention, an electronic device with a supporting function includes a user operable device placed on a plane. The electronic device further includes a foldable cover flexibly connected to the user operable device and capable of cover a whole top of the user operable device. The foldable cover includes a plurality of sections and a plurality of foldable lines formed between different sections, so that the foldable cover can be folded along the plurality of foldable lines. The plurality of foldable lines are formed by following way: (a) forming a left longitudinal foldable line; (b) a left lower foldable line joining the left longitudinal foldable line at a first point which is located at a bottom side of a left half foldable cover; (c) forming a right longitudinal foldable line; (d) a right lower foldable line joining the right longitudinal foldable line at a second point which is located at the bottom side of a right half foldable cover; (e) a left upper foldable line extending from a left side to an upper side of the foldable cover; and (f) a right upper foldable line extending from a right side to the upper side of the foldable cover. The left longitudinal foldable line and the right longitudinal foldable line extend from the bottom side to the upper side of the foldable cover, the left lower foldable line extends from the bottom side to the left side of the support cove, and the right lower foldable line extends from the bottom side to the right side of the foldable cover. The six foldable lines divide the foldable cover into at least following sections: (a') a main section; (b') a first supporting section pivoted to a first lateral side of the main section; (c') a second supporting section pivoted to a second lateral side of the main section; (d') a first fastening section pivoted to a lateral side of the first supporting section; (e') a second fastening section pivoted to a lateral side of the second supporting section; (f') a first attachment section pivoted to a bottom side of the first supporting section; and (g') a second attachment section pivoted to a bottom side of the second supporting section. These sections are connected through the six flexible foldable lines to allow the adjacent sections foldable with respective to one another to make the foldable cover in a supporting state, so that (i) the first fastening section and the second fastening section are releasably fastened together so as to fasten the first supporting section and the second supporting section, and (ii) the first attachment section and the second attachment section are placed flatly on the plane.

According to another embodiment of the present invention, the first fastening section includes a first magnetic component, the second fastening section includes a first magnetic induction component, and the first magnetic component and the first magnetic induction component are for releasably attracting each other so as to releasably fasten the first fastening section and the second fastening section. The foldable cover further includes a second magnetic component and a second magnetic induction component. The second magnetic component is disposed on the user operable device and corresponding to the first magnetic induction component, and the second magnetic induction component is disposed on the user operable device and corresponding to the first magnetic component. The first magnetic component and the second magnetic induction component are for releasably attracting each other and the first magnetic induction component and the second magnetic component are for releasably attracting each other, as the main section, the first supporting section, the second supporting section, the first fastening section and the second fastening section are for rotating in a direction close to the user operable device, so as to cover a top of the user operable device.

According to another embodiment of the present invention, the first fastening section comprises a third magnetic component, the second fastening section comprises a fourth magnetic component, and the third magnetic component and the fourth magnetic component are for releasably attracting each other due to being opposite magnetic poles so as to releasably fasten the first fastening section and the second fastening section. The foldable cover further includes a fifth magnetic component and a sixth magnetic component. The fifth magnetic component is disposed on the user operable device and corresponding to the third magnetic component. The fifth magnetic component and the third magnetic component are for releasably attracting each other due to being opposite magnetic poles. The sixth magnetic component is disposed on the user operable device and corresponding to the fourth magnetic component, and the sixth magnetic component and the fourth magnetic component are for releasably attracting each other due to being opposite magnetic poles. The fifth magnetic component and the third magnetic component are for releasably attracting each other and the sixth magnetic component and the fourth magnetic component are for releasably attracting each other, as the main section, the first supporting section, the second supporting section, the first fastening section and the second fastening section are for rotating in a direction close to the user operable device, so as to cover a top of the user operable device.

According to another embodiment of the present invention, the first fastening section includes a first velcro tape, the second fastening section includes a second velcro tape, and the first velcro tape and the second velcro tape are for releasably attaching each other so as to releasably fasten the first fastening section and the second fastening section. The foldable cover further includes a third velcro tape disposed on the user operable device and corresponding to the first velcro tape, and a fourth velcro tape disposed on the user operable device and corresponding to the second velcro tape. The third velcro tape and the first velcro tape are for releasably attaching each other and the fourth velcro tape and the second velcro tape are for releasably attaching each other, as the main section, the first supporting section, the second supporting section, the first fastening section and the second fastening section are for rotating in a direction close to the user operable device, so as to cover a top of the user operable device.

According to another embodiment of the present invention, the electronic device further includes a flexible connecting portion, one end of the flexible connecting portion is connected to a bottom side of the main section and no connection is with other sections. The other end of the flexible connecting portion is connected to the user operable device, so the main section is connected with the user operable device through the flexible connecting portion.

According to another embodiment of the present invention, the main section substantially has a shape of a trapezoid, a rectangle, or a triangle.

According to another embodiment of the present invention, when the foldable cover is in the supporting state, a receiving space is formed between the main section and the user operable device for receiving a bottom end of a portable device.

According to another embodiment of the present invention, an electronic device includes a user operable device placed on a plane, and a foldable cover flexibly connected to the electronic device. The foldable cover includes a plurality of sections and a plurality of foldable lines formed between different sections, so that the foldable cover can be folded along the plurality of foldable lines. The plurality of foldable lines are formed by following way: (a) a left longitudinal foldable line extending from a bottom side to an upper side of the foldable cover; (b) a left lower foldable line forming at a left side of the left longitudinal foldable line and extending from the bottom side to a left side of the foldable cover; (c) a right longitudinal foldable line forming at a right side of the left longitudinal foldable line and extending from the bottom side to the upper side of the foldable cover; (d) a right lower foldable line forming at a right side of the right longitudinal foldable line and extending from the bottom side to a right side of the foldable cover; (e) a left upper foldable line forming at the left side of the left longitudinal foldable line and extending from the left side to the upper side of the foldable cover; and (f) a right upper foldable line forming at the right side of the right longitudinal foldable line and extending from the right side to the upper side of the foldable cover. The plurality of foldable lines divide the foldable cover into at least following sections: (a') a main section; (b') a left supporting section pivoted to the main section through the left longitudinal foldable line; (c') a right supporting section pivoted the main section through the right longitudinal foldable line; (d') a left upper section pivoted to the left supporting section through the left upper foldable line; (e') a right upper section pivoted to the right supporting section through the right upper foldable line; (f') a left lower section pivoted to the left supporting section through the left lower foldable line; and (g') a right lower section pivoted the right supporting section through the right lower foldable line. When the foldable cover is in a supporting state, (i) the left upper section and the right upper section are releasably fastened together so as to fasten the left supporting section and the right supporting section, and (ii) the left lower section and the right lower section are placed flatly on the plane. When the foldable cover is in a non-supporting state, the plurality of sections are substantially extending in a same plane to cover the user operable device.

The present invention provides the user operable device with the foldable cover not only capable of covering the top of the user operable device for protecting the user operable device or preventing careless touch of the user operable device when the user operable device is not used, but also capable of supporting the portable device at the supporting state by rotation when the portable device is used, alternatively.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. Accordingly, the drawings and descriptions will be regarded as illustrative in nature and not as restrictive.

Figure 1:
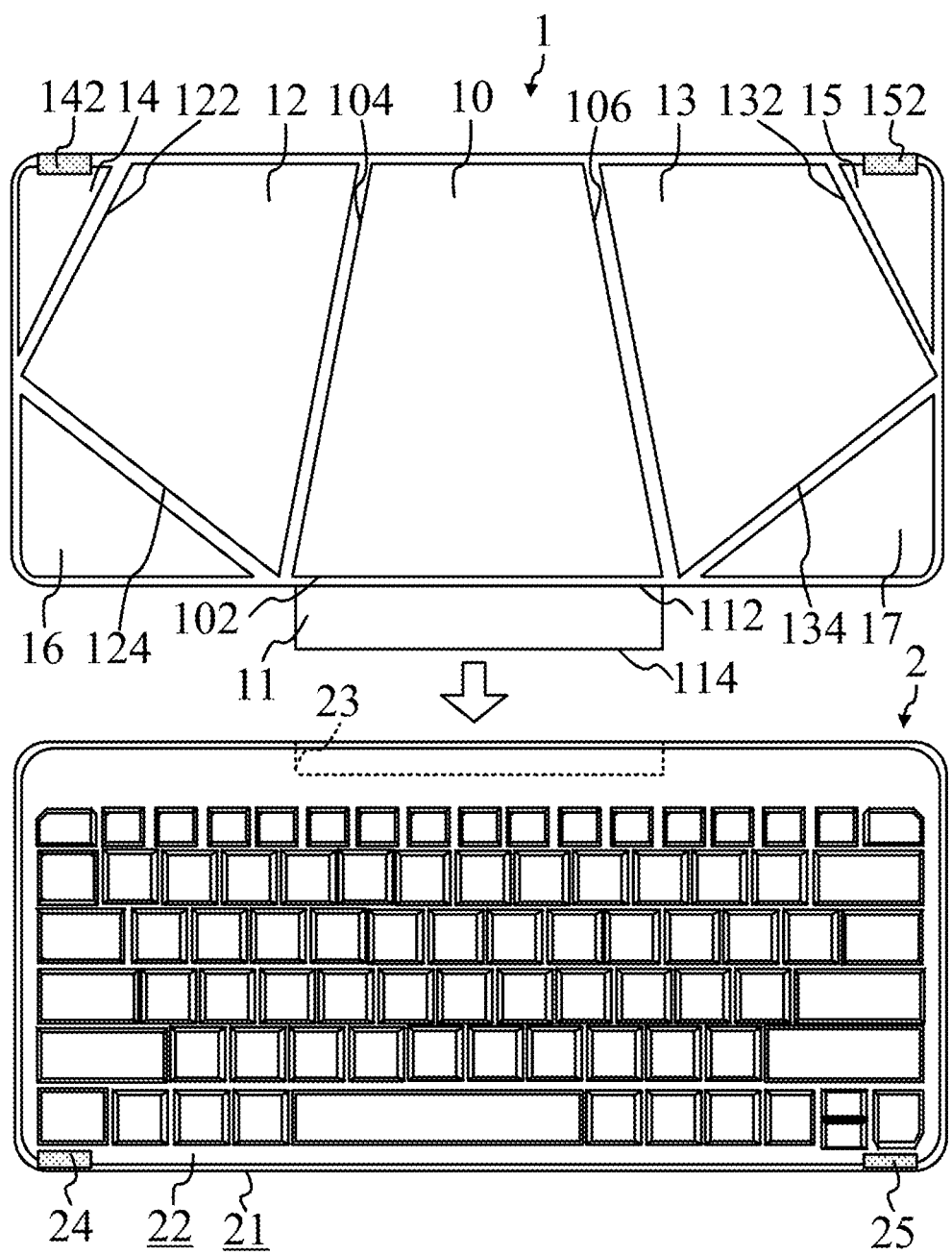
FIG. 1 to FIG. 6 are diagrams of a keyboard device with a support cooperating with a keyboard at different states according to a preferred embodiment of the present invention.
Figure 2:
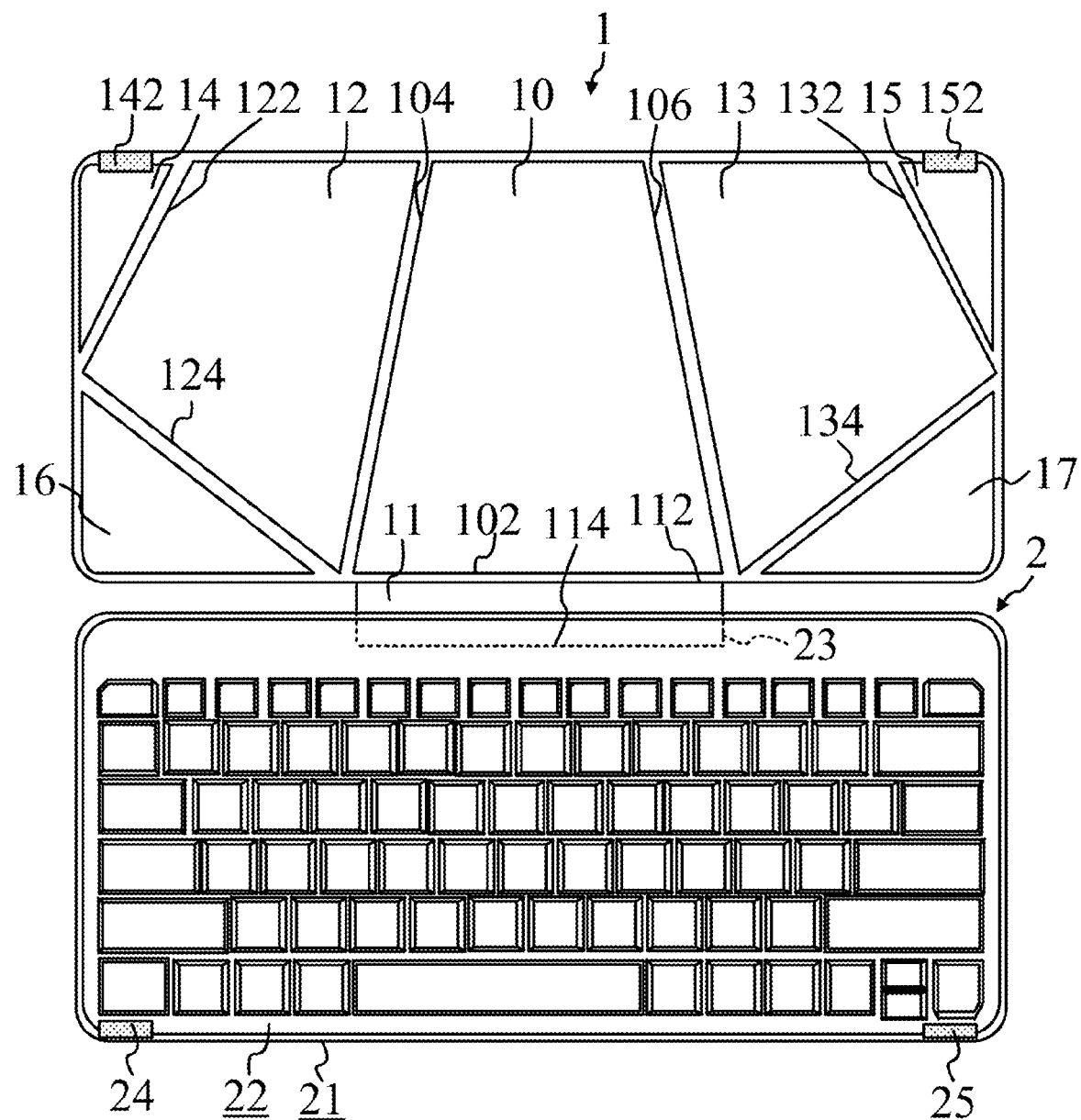

Please refer to FIG. 1 to FIG. 6. FIG. 1 to FIG. 6 are diagrams of a keyboard device with a support 1 cooperating with a keyboard 2 at different states according to a preferred embodiment of the present invention. As shown in FIG. 1, the support 1 includes a main body 10, a connecting portion 11, a first supporting portion 12 and a second supporting portion 13. One end 112 of the connecting portion 11 is pivoted to a bottom side 102 of the main body 10, and the other end 114 of the connecting portion 11 is connected to the keyboard 2. The other end 114 of the connecting portion 11 can be connected to a bottom 21 of the keyboard 2. For example, as shown in FIG. 2, the other end 114 of the connecting portion 11 can be inserted to a socket 23 on the bottom 21 of the keyboard 2.

Figure 4:
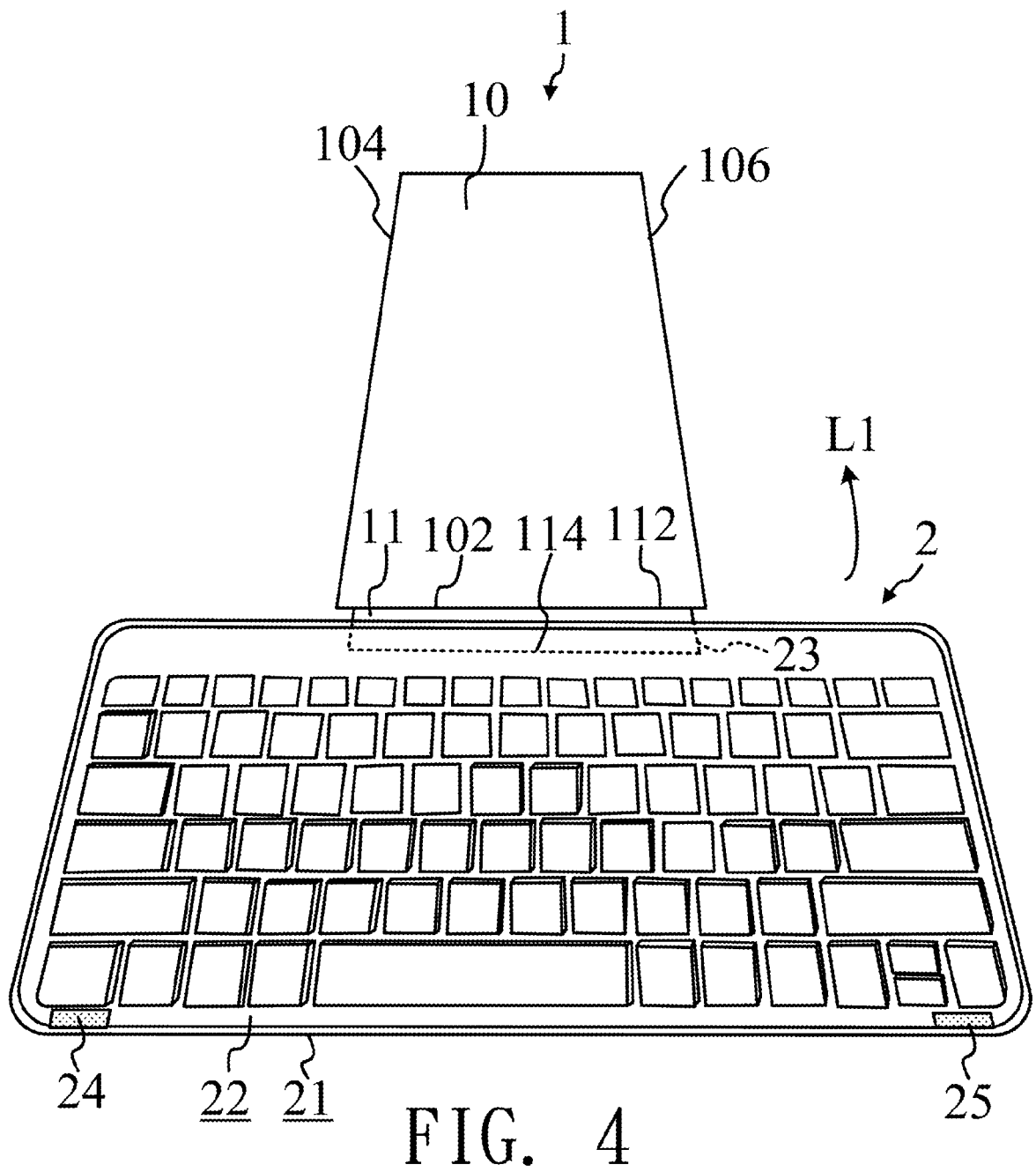
Figure 5:
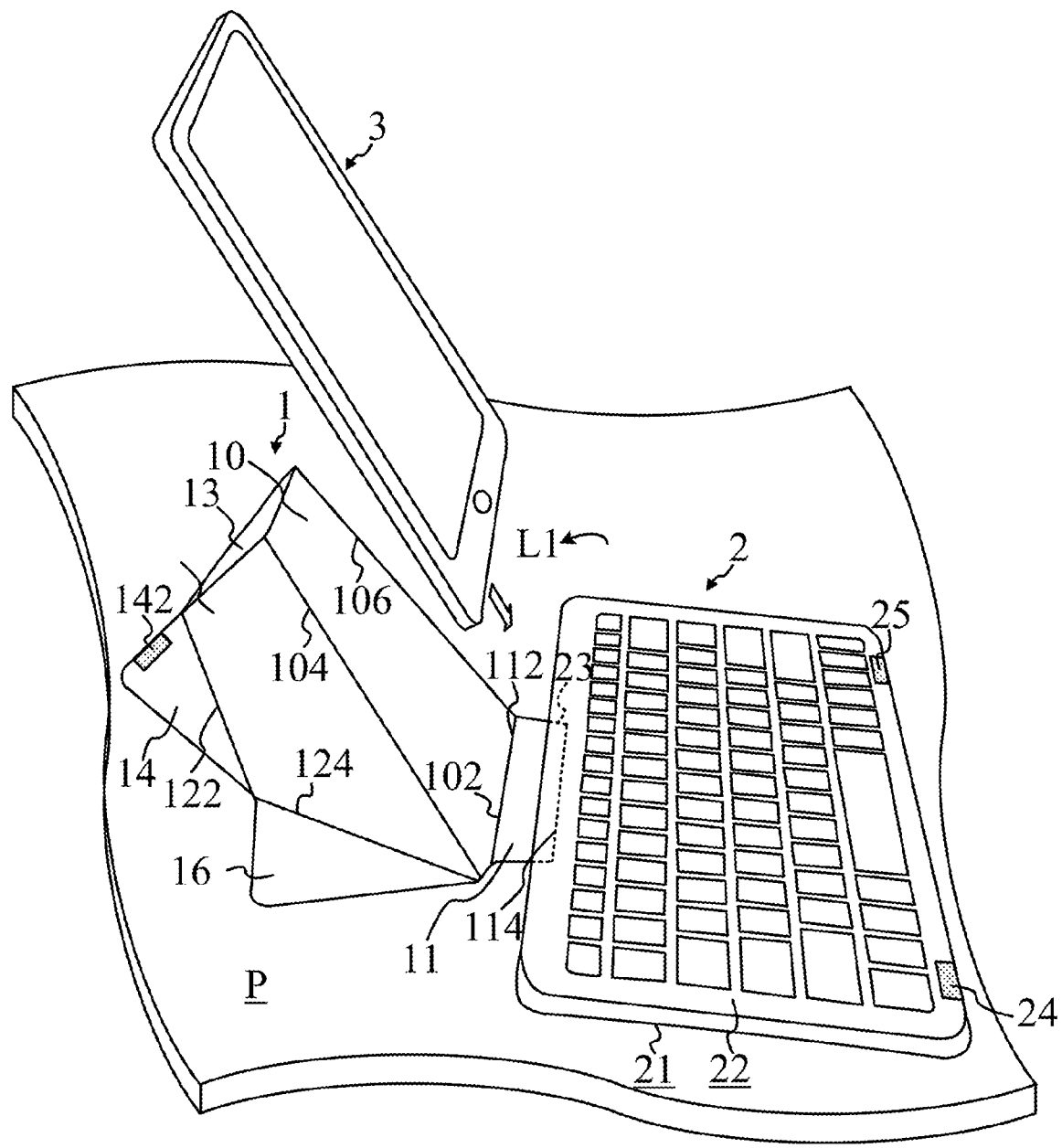
Figure 6:
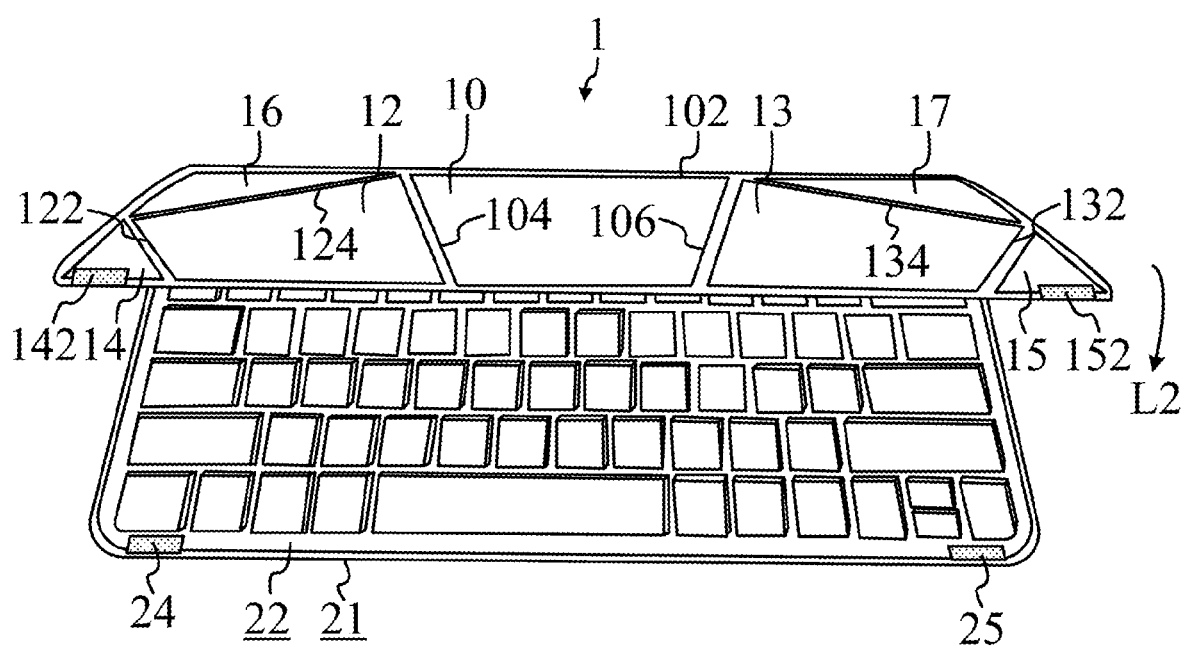

As shown in FIG. 4 to FIG. 6, the first supporting portion 12 is pivoted to a first lateral side 104 of the main body 10. The second supporting portion 13 is pivoted to a second lateral side 106 of the main body 10. The main body 10 can rotate in a first direction L1 away from the keyboard 2, the first supporting portion 12 and the second supporting portion 13 also can rotate in the first direction L1 away from the keyboard 2 so that a lateral side 122 of the first supporting portion 12 and a lateral side 132 of the second supporting portion 13 contact against each other, and a bottom side 124 of the first supporting portion 12 and a bottom side 134 of the second supporting portion 13 stand on a plane P, so as to support the support 1 on the plane P at a supporting state as the keyboard 2 is placed on the plane P.

The support 1 further includes a first fastening portion 14 and a second fastening portion 15. The first fastening portion 14 is pivoted to the lateral side 122 of the first supporting portion 12, and the second fastening portion 15 is pivoted to the lateral side 132 of the second supporting portion 13. The first fastening portion 14 and the second fastening portion 15 are for releasably being fastened together so as to fasten the lateral side 122 of the first supporting portion 12 and the lateral side 132 of the second supporting portion 13 as the support 1 is at the supporting state.

As shown in FIG. 5, the support 1 further includes a first attachment portion 16 and a second attachment portion 17. The first attachment portion 16 is pivoted to the bottom side 124 of the first supporting portion 12. The second attachment portion 17 is pivoted to the bottom side 134 of the second supporting portion 13. The first attachment portion 16 and the second attachment portion 17 are placed flatly on the plane P as the support 1 is at the supporting state. As shown in FIG. 6, the main body 10, the first supporting portion 12, the second supporting portion 13, the first fastening portion 14, the second fastening portion 15, the first attachment portion 16 and the second attachment portion 17 can rotate in a second direction L2 opposite to the first direction L1 and close to the keyboard 2, so as to cover a whole top 22 of the keyboard 2.

The main body 10, the connecting portion 11, the first supporting portion 12, the second supporting portion 13, the first fastening portion 14, the second fastening portion 15, the first attachment portion 16 and the second attachment portion 17 can be sheet structures, respectively. The main body 10 can substantially have a shape of a trapezoid, a rectangle, a triangle, and so on. In practical application, the first supporting portion 12, the second supporting portion 13, the first fastening portion 14, the second fastening portion 15, the first attachment portion 16 and the second attachment portion 17 can be made of stiff or half-stiff material, such as high polymer material, leather, metal material, and so on. The adjacent portions can be connected foldably or pivotably.

As shown in FIG. 5, a slot is formed between the main body 10, the connecting portion 11 and the keyboard 2 for accommodating a portable information processing device 3, such as a smart phone, a tablet computer, and so on, as the support 1 is at the supporting state. The support 1 can support the portable information processing device 3.

Figure 3:
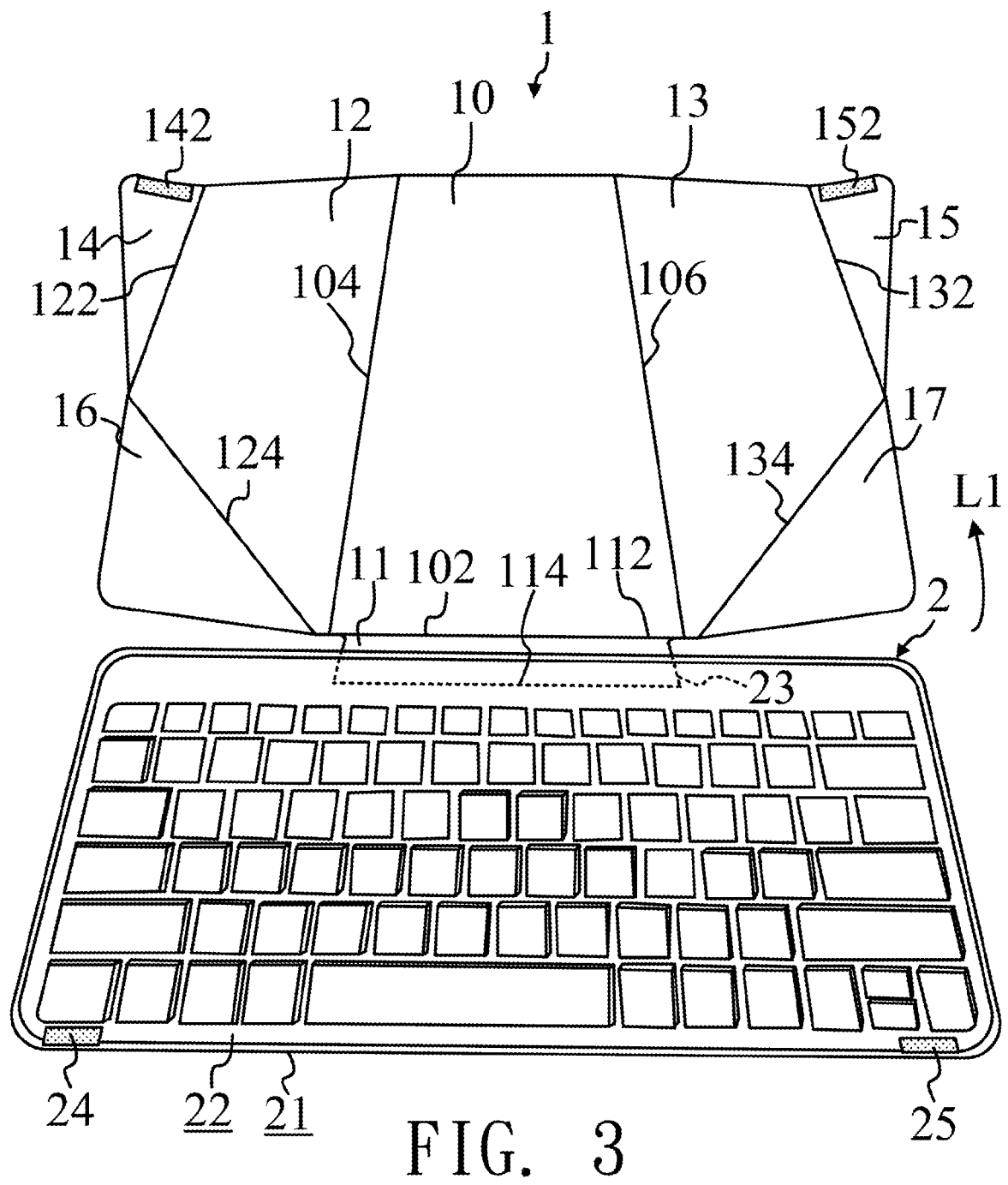

As shown in FIG. 3, the first fastening portion 14 includes a first magnetic component 142, and the second fastening portion 15 includes a first magnetic induction component 152. The first magnetic component 142 and the first magnetic induction component 152 are for releasably attracting each other so as to releasably fasten the first fastening portion 14 and the second fastening portion 15. Further, as shown in FIG. 6, the support 1 further includes a second magnetic induction component 24 disposed on the keyboard 2 and corresponding to the first magnetic component 142, and a second magnetic component 25 disposed on the keyboard 2 and corresponding to the first magnetic induction component 152. The first magnetic component 142 and the second magnetic induction component 24 can releasably attract each other by magnetic induction and the first magnetic induction component 152 and the second magnetic component 25 can releasably attract each other by magnetic induction, as the main body 10, the first supporting portion 12, the second supporting portion 13, the first fastening portion 14 and the second fastening portion 15 rotate in a second direction L2 opposite to the first direction L1 and close to the keyboard 2, so as to cover the top 22 of the keyboard 2.

Figure 7:
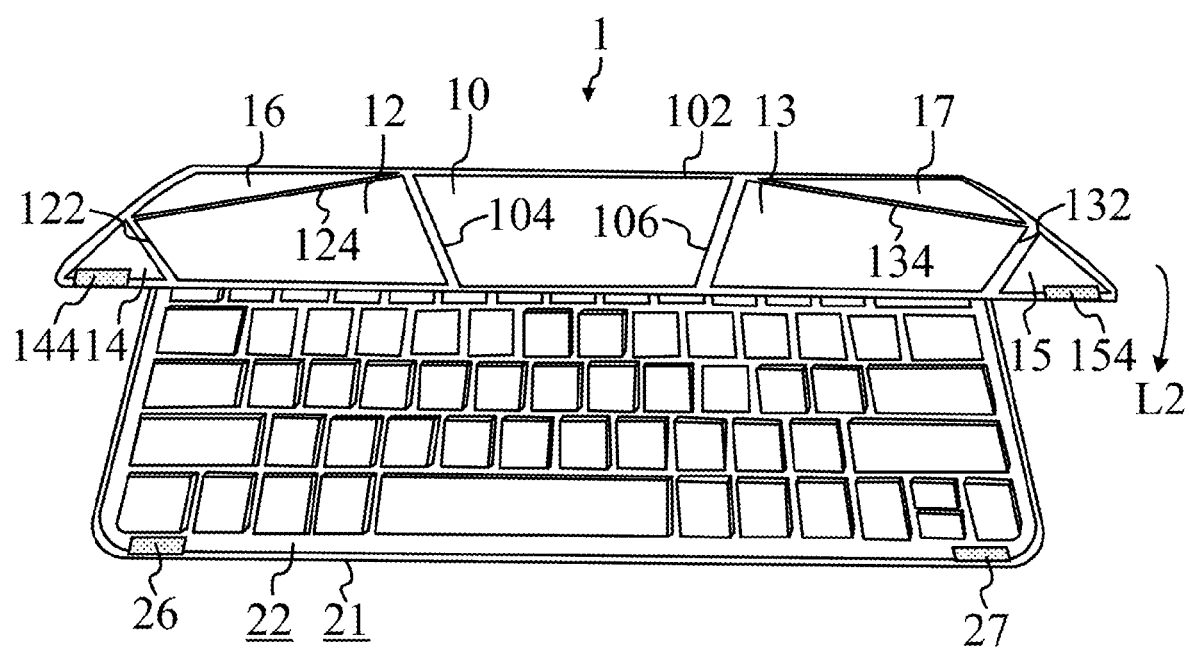
FIG. 7 to FIG. 9 are diagrams of the support according to other embodiments of the present invention.

Please refer to FIG. 7. FIG. 7 is a diagram of the support 1 according to another embodiment of the present invention. The first fastening portion 14 includes a third magnetic component 144, and the second fastening portion 15 includes a fourth magnetic component 154. The third magnetic component 144 and the fourth magnetic component 154 can releasably attract each other due to being opposite magnetic poles, so as to releasably fasten the first fastening portion 14 and the second fastening portion 15. Further, the support 1 further includes a fifth magnetic component 26 disposed on the keyboard 2 and corresponding to the third magnetic component 144, and a sixth magnetic component 27 disposed on the keyboard 2 and corresponding to the fourth magnetic component 154. The fifth magnetic component 26 and the third magnetic component 144 can releasably attract each other due to being opposite magnetic poles. The sixth magnetic component 27 and the fourth magnetic component 154 can releasably attract each other due to being opposite magnetic poles. The fifth magnetic component 26 and the third magnetic component 144 can releasably attract each other and the sixth magnetic component 27 and the fourth magnetic component 154 can releasably attract each other, as the main body 10, the first supporting portion 12, the second supporting portion 13, the first fastening portion 14 and the second fastening portion 15 rotate in the second direction L2 opposite to the first direction L1 and close to the keyboard 2, so as to cover the top 22 of the keyboard 2. In FIG. 7, the same components as those shown in FIG. 6 are denoted by the same reference numerals and a description thereof will not be repeated.

Figure 8:
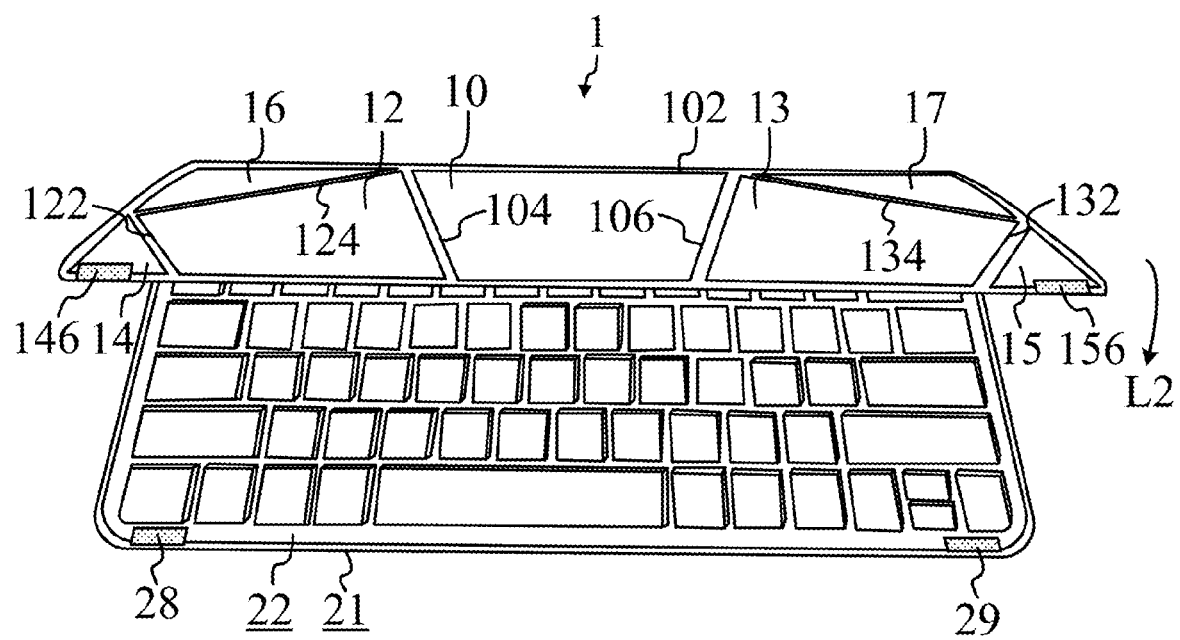

Please refer to FIG. 8. FIG. 8 is a diagram of the support 1 according to another embodiment of the present invention. The first fastening portion 14 includes a first velcro tape 146, and the second fastening portion 15 includes a second velcro tape 156. The first velcro tape 146 and the second velcro tape 156 can releasably attach each other so as to releasably fasten the first fastening portion 14 and the second fastening portion 15. The supporting 1 further includes a third velcro tape 28 disposed on the keyboard 2 and corresponding to the first velcro tape 146, and a fourth velcro tape 29 disposed on the keyboard 2 and corresponding to the second velcro tape 156. The third velcro tape 28 and the first velcro tape 146 can releasably attach each other and the fourth velcro tape 29 and the second velcro tape 156 can releasably attach each other, as the main body 10, the first supporting portion 12, the second supporting portion 13, the first fastening portion 14 and the second fastening portion 15 rotate in the second direction L2 opposite to the first direction L1 and close to the keyboard 2, so as to cover the top 22 of the keyboard 2. In FIG. 8, the same components as those shown in FIG. 6 are denoted by the same reference numerals and a description thereof will not be repeated.

Figure 9:
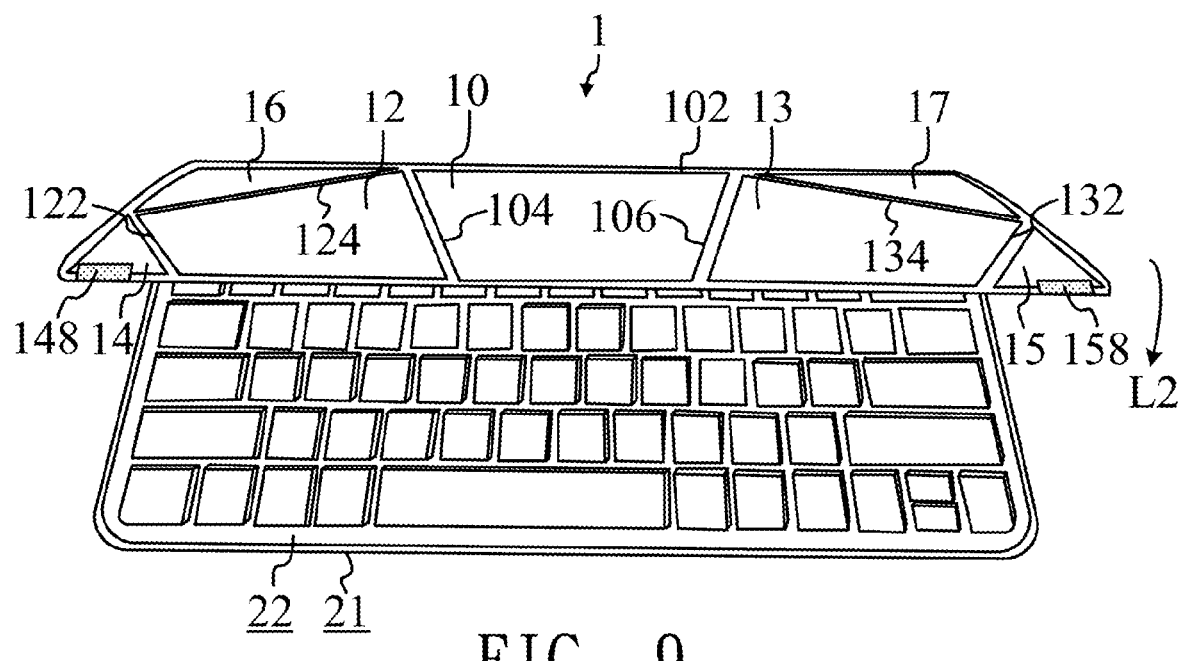

Please refer to FIG. 9. FIG. 9 is a diagram of the support 1 according to another embodiment of the present invention. The first fastening portion 14 includes a reusable adhesive layers 148, and the second fastening portion 15 includes a reusable adhesive layers 158. The first fastening portion 14 and the second fastening portion 15 can be releasably fastened by affixing the reusable adhesive layer 148 and the reusable adhesive layers 158. The reusable adhesive layer 148 and the reusable adhesive layer 158 can be affixed to the top 22 of the keyboard 2 repeatedly, as the main body 10, the first supporting portion 12, the second supporting portion 13, the first fastening portion 14 and the second fastening portion 15 rotate in the second direction L2 opposite to the first direction L1 and close to the keyboard 2, so as to cover the top 22 of the keyboard 2. In FIG. 9, the same components as those shown in FIG. 6 are denoted by the same reference numerals and a description thereof will not be repeated.

In contrast with the prior art, the present invention provides the keyboard device with the support not only capable of covering the top of the keyboard for protecting the keyboard or preventing careless touch of the keyboard when the keyboard is not used, but also capable of supporting the portable information processing device at the supporting state by rotation when the portable information processing device is used, alternatively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device with a supporting function, comprising:
   a user operable device placed on a plane;
   a foldable cover flexibly connected to the user operable device and capable to cover a whole top of the user operable device, the foldable cover comprising a plurality of sections and a plurality of foldable lines formed between different sections, so that the foldable cover can be folded along the plurality of foldable lines;
   wherein the plurality of foldable lines are formed by following way:
   (a) forming a left longitudinal foldable line;
   (b) a left lower foldable line joining the left longitudinal foldable line at a first point which is located at a bottom side of a left half foldable cover;
   (c) forming a right longitudinal foldable line;
   (d) a right lower foldable line joining the right longitudinal foldable line at a second point which is located at the bottom side of a right half foldable cover;
   (e) a left upper foldable line extending from a left side to an upper side of the foldable cover; and
   (f) a right upper foldable line extending from a right side to the upper side of the foldable cover;
   wherein the left longitudinal foldable line and the right longitudinal foldable line extend from the bottom side to the upper side of the foldable cover, the left lower foldable line extends from the bottom side to the left side of the foldable cover, and the right lower foldable line extends from the bottom side to the right side of the foldable cover, and the six foldable lines divide the foldable cover into at least following sections:
   (a') a main section;
   (b') a first supporting section pivoted to a first lateral side of the main section;
   (c') a second supporting section pivoted to a second lateral side of the main section;
   (d') a first fastening section pivoted to a lateral side of the first supporting section;
   (e') a second fastening section pivoted to a lateral side of the second supporting section;
   (f') a first attachment section pivoted to a bottom side of the first supporting section; and
   (g') a second attachment section pivoted to a bottom side of the second supporting section;
      wherein these sections are connected through the six flexible foldable lines to allow the adjacent sections foldable with respective to one another to make the foldable cover in a supporting state, so that the first fastening section and the second fastening section are releasably fastened together so as to fasten the first supporting section and the second supporting section, and the first attachment section and the second attachment section are placed flatly on the plane.

2. The electronic device of claim 1, wherein the first fastening section comprises a first magnetic component, the second fastening section comprises a first magnetic induction component, and the first magnetic component and the first magnetic induction component are for releasably attracting each other so as to releasably fasten the first fastening section and the second fastening section.

3. The electronic device of claim 2, wherein the foldable cover further comprises:
   a second magnetic component disposed on the user operable device and corresponding to the first magnetic induction component; and
   a second magnetic induction component disposed on the user operable device and corresponding to the first magnetic component;
   wherein the first magnetic component and the second magnetic induction component are for releasably attracting each other and the first magnetic induction component and the second magnetic component are for releasably attracting each other, as the main section, the first supporting section, the second supporting section, the first fastening section and the second fastening section are for rotating in a direction close to the user operable device, so as to cover a top of the user operable device.

4. The electronic device of claim 1, wherein the first fastening section comprises a third magnetic component, the second fastening section comprises a fourth magnetic component, and the third magnetic component and the fourth magnetic component are for releasably attracting each other due to being opposite magnetic poles so as to releasably fasten the first fastening section and the second fastening section.

5. The electronic device of claim 4, wherein the foldable cover further comprises:
   a fifth magnetic component disposed on the user operable device and corresponding to the third magnetic component, the fifth magnetic component and the third magnetic component being for releasably attracting each other due to being opposite magnetic poles; and
   a sixth magnetic component disposed on the user operable device and corresponding to the fourth magnetic component, the sixth magnetic component and the fourth magnetic component being for releasably attracting each other due to being opposite magnetic poles;
   wherein the fifth magnetic component and the third magnetic component are for releasably attracting each other and the sixth magnetic component and the fourth magnetic component are for releasably attracting each other, as the main section, the first supporting section, the second supporting section, the first fastening section and the second fastening section are for rotating in a direction close to the user operable device, so as to cover a top of the user operable device.

6. The electronic device of claim 1, wherein the first fastening section comprises a first velcro tape, the second fastening section comprises a second velcro tape, and the first velcro tape and the second velcro tape are for releasably attaching each other so as to releasably fasten the first fastening section and the second fastening section.

7. The electronic device of claim 6, wherein the foldable cover further comprises:
   a third velcro tape disposed on the user operable device and corresponding to the first velcro tape; and
   a fourth velcro tape disposed on the user operable device and corresponding to the second velcro tape;
   wherein the third velcro tape and the first velcro tape are for releasably attaching each other and the fourth velcro tape and the second velcro tape are for releasably attaching each other, as the main section, the first supporting section, the second supporting section, the first fastening section and the second fastening section are for rotating in a direction close to the user operable device, so as to cover a top of the user operable device.

8. The electronic device of claim 1, further comprising a flexible connecting portion, one end of the flexible connecting portion being connected to a bottom side of the main section and no connection being with the other sections, and the other end of the flexible connecting portion being connected to the user operable device, so the main section is connected with the user operable device through the flexible connecting portion.

9. The electronic device of claim 1, wherein the main section substantially has a shape of a trapezoid, a rectangle, or a triangle.

10. The electronic device of claim 1, wherein when the foldable cover is in the supporting state, a receiving space is formed between the main section and the user operable device for receiving a bottom end of a portable device.

11. An electronic device with a supporting function, the electronic device comprising:
   a user operable device placed on a plane;
   a foldable cover flexibly connected to the user operable device, the foldable cover comprising a plurality of sections and a plurality of foldable lines formed between different sections, so that the foldable cover can be folded along the plurality of foldable lines;
   wherein the plurality of foldable lines are formed by following way:
   (a) a left longitudinal foldable line extending from a bottom side to an upper side of the foldable cover;
   (b) a left lower foldable line forming at a left side of the left longitudinal foldable line and extending from the bottom side to a left side of the foldable cover;
   (c) a right longitudinal foldable line forming at a right side of the left longitudinal foldable line and extending from the bottom side to the upper side of the foldable cover;
   (d) a right lower foldable line forming at a right side of the right longitudinal foldable line and extending from the bottom side to a right side of the foldable cover;
   (e) a left upper foldable line forming at the left side of the left longitudinal foldable line and extending from the left side to the upper side of the foldable cover; and
   (f) a right upper foldable line forming at the right side of the right longitudinal foldable line and extending from the right side to the upper side of the foldable cover;
   wherein the plurality of foldable lines divide the foldable cover into at least following sections:
   (a') a main section;
   (b') a left supporting section pivoted to the main section through the left longitudinal foldable line;
   (c') a right supporting section pivoted the main section through the right longitudinal foldable line;
   (d') a left upper section pivoted to the left supporting section through the left upper foldable line;
   (e') a right upper section pivoted to the right supporting section through the right upper foldable line;
   (f') a left lower section pivoted to the left supporting section through the left lower foldable line; and
   (g') a right lower section pivoted the right supporting section through the right lower foldable line;
   wherein when the foldable cover is in a supporting state, the left upper section and the right upper section are releasably fastened together so as to fasten the left supporting section and the right supporting section, and the left lower section and the right lower section are placed flatly on the plane;
   wherein when the foldable cover is in a non-supporting state, the plurality of sections are substantially extending in a same plane to cover the user operable device.

12. The electronic device of claim 11, wherein the left upper section comprises a first magnetic component the right upper section comprises a first magnetic induction component or a fourth magnetic component, so that the left upper section and the right upper section are releasably fasten.

13. The electronic device of claim 12, wherein the foldable cover further comprises:
   a second magnetic component disposed on the user operable device and corresponding to the first magnetic induction component; and
   a second magnetic induction component disposed on the user operable device and corresponding to the first magnetic component;
   wherein the first magnetic component and the second magnetic induction component are for releasably attracting each other and the first magnetic induction component and the second magnetic component are for releasably attracting each other, as the main section, the left supporting section, the right supporting section, the left upper section and the right upper section are for rotating in a direction close to the user operable device, so as to cover a top of the user operable device.

14. The electronic device of claim 11, wherein the left upper section comprises a first velcro tape, the right upper section comprises a second velcro tape, and the first velcro tape and the second velcro tape are for releasably attaching each other so as to releasably fasten the left upper section and the right upper section.

15. The electronic device of claim 14, wherein the foldable cover further comprises:
   a third velcro tape disposed on the user operable device and corresponding to the first velcro tape; and
   a fourth velcro tape disposed on the user operable device and corresponding to the second velcro tape;
   wherein the third velcro tape and the first velcro tape are for releasably attaching each other and the fourth velcro tape and the second velcro tape are for releasably attaching each other, as the main section, the left supporting section, the right supporting section, the left upper section and the right upper section are for rotating in a direction close to the user operable device, so as to cover a top of the user operable device.

16. The electronic device of claim 11, wherein the main section substantially has a shape of a trapezoid, a rectangle, or a triangle.

17. The electronic device of claim 11, wherein when the foldable cover is in the supporting state, a receiving space is formed between the main section and the user operable device for receiving a bottom end of a portable device.

18. The electronic device of claim 11, further comprising a flexible connecting portion, an upper end of the connecting portion being connected to a bottom side of the main section and no connection being with the other sections, and a lower end of the connecting portion being connected to the user operable device, so the main section is connected with the user operable device through the flexible connecting portion.

19. The electronic device of claim 11, wherein the left lower foldable line joins the left longitudinal foldable line at a first point located at the bottom side of the foldable cover, and the right lower foldable line joins the right longitudinal foldable line at a second point located at the bottom side of the foldable cover, so that when the foldable cover is in the supporting state, both lower ends of the left longitudinal foldable line and the right lower foldable line contact the plane.

20. The electronic device of claim 11, wherein an upper end of the left upper foldable line is separated from an upper end of the left longitudinal foldable line, and an upper end of the right upper foldable line is separated from an upper end of the right longitudinal foldable line.

* * * * *